US008993201B2

(12) United States Patent
Mikami et al.

(10) Patent No.: US 8,993,201 B2
(45) Date of Patent: *Mar. 31, 2015

(54) REFLECTIVE LAYER-EQUIPPED SUBSTRATE FOR EUV LITHOGRAPHY, REFLECTIVE MASK BLANK FOR EUV LITHOGRAPHY, REFLECTIVE MASK FOR EUV LITHOGRAPHY, AND PROCESS FOR PRODUCTION OF THE REFLECTIVE LAYER-EQUIPPED SUBSTRATE (75) Inventors: Masaki Mikami, Tokyo (JP); Mitsuhiko Komakine, Tokyo (JP); Yoshiaki Ikuta, Tokyo (JP)

(73) Assignee: Asahi Glass Company, Limited, Tokyo (JP)

(*) Notice: Subject to any disclaimer, the term of this patent is extended or adjusted under 35 U.S.C. 154(b) by 144 days.

This patent is subject to a terminal disclaimer.

(21) Appl. No.: 13/478,532

(22) Filed: May 23, 2012

(65) Prior Publication Data

US 2012/0231378 A1    Sep. 13, 2012

Related U.S. Application Data (63) Continuation of application No. PCT/JP2010/072161, filed on Dec. 9, 2010.

(30) Foreign Application Priority Data

Dec. 9, 2009 (JP) ................. 2009-279371
Dec. 25, 2009 (JP) ................. 2009-294310
Feb. 3, 2010 (JP) ................. 2010-021944
Mar. 24, 2010 (JP) ................. 2010-067421
Jun. 14, 2010 (JP) ................. 2010-134822

(51) Int. Cl.
G03F 1/24 (2012.01)
B82Y 10/00 (2011.01)
B82Y 40/00 (2011.01)
G02B 5/08 (2006.01)
G03F 7/20 (2006.01)

(52) U.S. Cl.
CPC . *G03F 1/24* (2013.01); *B82Y 10/00* (2013.01); *B82Y 40/00* (2013.01); *G02B 5/0891* (2013.01); *G03F 7/70316* (2013.01); *G03F 7/70958* (2013.01); *G03F 7/70983* (2013.01)
USPC ............... 430/5; 430/327; 430/330

(58) Field of Classification Search
CPC ...................................... G03F 1/24
USPC .......................... 430/4–5, 327, 330
See application file for complete search history.

(56) References Cited

U.S. PATENT DOCUMENTS

| 5,928,817 | A  | 7/1999  | Yan et al. |
|---|---|---|---|
| 6,410,193 | B1 | 6/2002  | Stivers et al. |
| 6,479,195 | B1 | 11/2002 | Kirchauer et al. |
| 6,506,526 | B2 | 1/2003  | Stivers et al. |
| 6,583,068 | B2 | 6/2003  | Yan et al. |
| 6,593,037 | B1 | 7/2003  | Gabriel et al. |
| 6,593,041 | B2 | 7/2003  | Yan |
| 6,596,465 | B1 | 7/2003  | Mangat et al. |
| 6,607,862 | B2 | 8/2003  | Yan et al. |
| 6,610,447 | B2 | 8/2003  | Yan et al. |
| 6,627,362 | B2 | 9/2003  | Stivers et al. |
| 6,630,273 | B2 | 10/2003 | Yan et al. |
| 6,645,679 | B1 | 11/2003 | La Fontaine et al. |
| 6,653,053 | B2 | 11/2003 | Mangat et al. |
| 6,699,625 | B2 | 3/2004  | Lee et al. |
| 6,720,118 | B2 | 4/2004  | Yan et al. |
| 6,797,368 | B2 | 9/2004  | Shoki |
| 6,818,357 | B2 | 11/2004 | Yan |
| 6,830,851 | B2 | 12/2004 | Yan |
| 6,905,801 | B2 | 6/2005  | Liang et al. |
| 6,908,713 | B2 | 6/2005  | Silverman |
| 6,908,714 | B2 | 6/2005  | Yan et al. |
| 6,913,706 | B2 | 7/2005  | Yan et al. |
| 6,998,200 | B2 | 2/2006  | Lee |
| 7,078,134 | B2 | 7/2006  | Wurm et al. |
| 7,090,948 | B2 | 8/2006  | Rau |
| 7,118,832 | B2 | 10/2006 | Yan |
| 7,172,788 | B2 | 2/2007  | Yakshin et al. |
| 7,300,724 | B2 | 11/2007 | Yan |
| 7,384,715 | B2 | 6/2008  | Lee |
| 7,833,682 | B2 | 11/2010 | Hayashi et al. |
| 7,906,259 | B2 | 3/2011  | Hayashi et al. |
| 8,088,538 | B2 | 1/2012  | Hayashi et al. |

(Continued)

FOREIGN PATENT DOCUMENTS

| JP | 2005-268750 | 9/2005 |
|---|---|---|
| JP | 2005-286203 | 10/2005 |

(Continued)

OTHER PUBLICATIONS

U.S. Appl. No. 13/443,108, filed Apr. 10, 2012, Mikami, et al.

(Continued)

Primary Examiner — Christopher Young
(74) Attorney, Agent, or Firm — Oblon, McClelland, Maier & Neustadt, L.L.P.

(57) ABSTRACT

Provided are an EUV mask blank in which deterioration in reflectivity due to oxidation of a Ru protective layer is prevented, a reflective layer-equipped substrate to be used for producing the EUV mask blank, and a process for producing the reflective layer-equipped substrate. A reflective layer-equipped substrate for EUV lithography comprising a substrate, and a reflective layer for reflecting EUV light and a protective layer for protecting the reflective layer, formed in this order on the substrate, wherein the reflective layer is a Mo/Si multilayer reflective film, the protective layer is a Ru layer or a Ru compound layer, and an intermediate layer containing from 0.5 to 25 at % of nitrogen and from 75 to 99.5 at % of Si is formed between the reflective layer and the protective layer.

20 Claims, 1 Drawing Sheet

(56) References Cited

U.S. PATENT DOCUMENTS

| | | | |
|---|---|---|---|
| 2006/0270226 A1* | 11/2006 | Hosoya | 430/5 |
| 2008/0182183 A1* | 7/2008 | Hayashi et al. | 430/5 |
| 2009/0023254 A1* | 1/2009 | Lim et al. | 438/151 |
| 2009/0042110 A1 | 2/2009 | Matsuo et al. | |
| 2013/0115547 A1* | 5/2013 | Mikami et al. | 430/5 |

FOREIGN PATENT DOCUMENTS

| | | |
|---|---|---|
| JP | 2006-170911 | 6/2006 |
| JP | 2006-170916 | 6/2006 |
| JP | 2006-171577 | 6/2006 |
| JP | 2006-173446 | 6/2006 |
| JP | 2006-332153 | 12/2006 |
| JP | 2007-311758 A | 11/2007 |
| JP | 2008-16821 A | 1/2008 |
| WO | WO 2008/129908 A1 | 10/2008 |
| WO | WO 2009/116348 A1 | 9/2009 |

OTHER PUBLICATIONS

U.S. Appl. No. 13/469,161, filed May 11, 2012, Mikami.
U.S. Appl. No. 13/472,002, May 15, 2012, Mikami.
U.S. Appl. No. 13/937,771, filed Jul. 9, 2013, Mikami.
Combined Chinese Office Action and Search Report issued May 30, 2013 in Patent Application No. 201080056266.8 with English Translation and English Translation of Category of Cited Documents.
International Search Report issued Mar. 15, 2011 in PCT/JP10/072161 filed Dec. 9, 2010.

\* cited by examiner

REFLECTIVE LAYER-EQUIPPED SUBSTRATE FOR EUV LITHOGRAPHY, REFLECTIVE MASK BLANK FOR EUV LITHOGRAPHY, REFLECTIVE MASK FOR EUV LITHOGRAPHY, AND PROCESS FOR PRODUCTION OF THE REFLECTIVE LAYER-EQUIPPED SUBSTRATE

This application is a continuation of PCT Application No. PCT/JP2010/072161, filed Dec. 9, 2010, which is based upon and claims the benefit of priority from Japanese Patent Application No. 2009-279371 filed on Dec. 9, 2009, Japanese Patent Application No. 2009-294310 filed on Dec. 25, 2009, Japanese Patent Application No. 2010-021944 filed on Feb. 3, 2010, Japanese Patent Application No. 2010-067421 filed on Mar. 24, 2010 and Japanese Patent Application No. 2010-134822 filed on Jun. 14, 2010. The contents of those applications are incorporated herein by reference in its entirety.

TECHNICAL FIELD

The present invention relates to a reflective layer-equipped substrate for EUV (Extreme Ultraviolet, hereinafter abbreviated as EUV) lithography to be used for e.g. production of semiconductors, a reflective mask blank for EUV lithography (hereinafter referred to also as an "EUV mask blank"), a reflective mask for EUV lithography (hereinafter referred to also as an "EUV mask") obtained by patterning the EUV mask blank, and a process for producing the reflective layer-equipped substrate, as well as a process for producing a semiconductor integrated circuit by means of the EUV mask.

BACKGROUND ART

Heretofore, in the semiconductor industry, a photolithography method employing visible light or ultraviolet light has been used as a technique to transfer a fine pattern required to form an integrated circuit with a fine pattern on e.g. a silicon substrate. However, the conventional photolithography method has come close to its limit, while miniaturization of semiconductor devices is being accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (193 nm) is employed, about 45 nm is presumed to be the limit. Under the circumstances, as an exposure technique for the next generation employing an exposure wavelength shorter than 45 nm, EUV lithography is expected to be prospective, which is an exposure technique employing EUV light having a wavelength further shorter than ArF laser. In this specification, EUV light is meant for light ray having a wavelength within a soft X-ray region or within a vacuum ultraviolet region, specifically for light ray having a wavelength of from about 10 to 20 nm, particularly about 13.5 nm±0.3 nm.

EUV light is likely to be absorbed by all kinds of substances, and the refractive index of substances at such a wavelength is close to 1, whereby it is not possible to use a conventional refractive optical system like photolithography employing visible light or ultraviolet light. Therefore, in EUV lithography, a reflective optical system, i.e. a reflective photomask and mirror, is employed.

A mask blank is a laminate before pattering, to be used for the production of a photomask. In the case of an EUV mask blank, it has a structure wherein a reflective layer to reflect EUV light and an absorber layer to absorb EUV light, are formed in this order on a substrate made of e.g. glass. As the reflective layer, it is common to use a Mo/Si multilayer reflective film having a molybdenum (Mo) layer as a low refractive index layer and a silicon (Si) layer as a high refractive index layer alternately laminated to have the light reflectivity improved when the layer surface is irradiated with EUV light.

For the absorber layer, a material having a high absorption coefficient to EUV light, specifically e.g. a material containing chromium (Cr) or tantalum (Ta) as the main component, is used.

Usually, a protective layer is formed between the above reflective layer and the absorber layer. Such a protective layer is one to be provided for the purpose of protecting the reflective layer, so that the reflective layer will not be damaged by an etching process to be carried out for the purpose of forming a pattern on the absorber layer. In Patent Document 1, it is proposed to use ruthenium (Ru) as the material for the protective layer. In Patent Document 2, a protective layer is proposed which is made of a ruthenium compound (Ru content: 10 to 95 at %) containing Ru and at least one member selected from Mo, Nb, Zr, Y, B, Ti and La.

PRIOR ART DOCUMENTS

Patent Documents

Patent Document 1: JP-A-2002-122981 (U.S. Pat. No. 6,699,625)
Patent Document 2: JP-A-2005-268750

DISCLOSURE OF INVENTION

Technical Problem

In a case where Ru is employed as the material for the protective layer, a high etching selectivity can be obtained to the absorber layer, and even in a case where the protective layer is formed on the reflective layer, a high reflectivity is obtainable when the protective layer surface is irradiated with EUV light. However, in a case where Ru is employed as the material for the protective layer, there is a problem such that the EUV light reflectivity at the time when the protective layer surface is irradiated with EUV light is likely to be low, since the Ru protective layer, and further, the uppermost layer on the multilayer reflective film (the Si layer in the case of the Mo/Si multilayer reflective film) are oxidized in a step for producing a mask blank or in a step for producing a photomask from the mask blank (e.g. a step of cleaning, defect inspection, heating, dry etching or defect correction) or during the EUV exposure.

Especially, deterioration of the EUV light reflectivity during the EUV exposure progresses as the time passes, thus leading to such a problem that it is required to change the exposure conditions in a half way, or the useful life of the photomask tends to be short.

Hereinafter, in this specification, deterioration of the EUV light reflectivity at the time when the protective layer surface is irradiated with EUV light, due to oxidation of the Ru protective layer and further the uppermost layer of the multilayer reflective film in a step for producing a mask blank or in a step for producing a photomask from the mask blank (e.g. a step of cleaning, defect inspection, heating, dry etching or defect correction) or during the EUV exposure, may be referred to simply as "deterioration in the EUV light reflectivity due to oxidation of the Ru protective layer".

The protective layer as disclosed in Patent Document 2 is to bring about no deterioration in the reflectivity of the multilayer reflective film and yet to provide a sufficient effect to prevent oxidation of the multilayer reflective film. However, as is apparent from the disclosure in paragraph [0006] in this document, the deterioration in the reflectivity of the multilayer reflective film mentioned here means that by e.g. heat treatment during the formation of the Ru protective layer or subsequent heat treatment, the Ru protective layer and the Si layer as the upper layer of the multilayer reflective film are likely to form a diffused layer, whereby the reflectivity is likely to be deteriorated, but there is no mention about deterioration in the EUV reflectivity due to oxidation of the Ru protective layer as described above.

From the above described viewpoint, it is an object of the present invention to provide a reflective layer-equipped substrate for EUV lithography, a reflective mask blank for EUV lithography and a reflective mask for EUV lithography, in which deterioration in the EUV light reflectivity due to oxidation of the Ru protective layer is prevented, and a process for producing such a reflective layer-equipped substrate for EUV lithography.

Solution to Problem

The present inventors have conducted an extensive study to solve the above problem and as a result, have found it possible to suppress the deterioration of the EUV light reflectivity due to oxidation of the Ru protective layer by forming an intermediate layer containing nitrogen and Si in prescribed amounts, between the Mo/Si multilayer reflective film and the Ru protective layer.

The present invention has been made based on the above discovery by the present inventors and provides a reflective layer-equipped substrate for EUV lithography (hereinafter referred to also as a "reflective layer-equipped substrate of the present invention" in this specification) comprising a substrate, and a reflective layer for reflecting EUV light and a protective layer for protecting the reflective layer, formed in this order on the substrate, wherein the reflective layer is a Mo/Si multilayer reflective film, the protective layer is a Ru layer or a Ru compound layer, and an intermediate layer containing from 0.5 to 25 at % of nitrogen and from 75 to 99.5 at % of Si is formed between the reflective layer and the protective layer.

In the reflective layer-equipped substrate of the present invention, it is preferred that the uppermost layer of the reflective layer made of a Mo/Si multilayer reflective film is a Si film, and the intermediate layer is formed in contact with the Si film.

In the reflective layer-equipped substrate of the present invention, it is preferred that the thickness of the intermediate layer is from 0.2 to 2.5 nm.

In the reflective layer-equipped substrate of the present invention, it is preferred that the surface roughness rms of the surface of the protective layer is at most 0.5 nm.

In the reflective layer-equipped substrate of the present invention, it is preferred that the thickness of the protective layer is from 1 to 10 nm.

Further, the present invention provides a reflective mask blank for EUV lithography (hereinafter referred to also as an "EUV mask blank of the present invention") having an absorber layer formed on the protective layer of the above reflective layer-equipped substrate of the present invention.

In the EUV mask blank of the present invention, it is preferred that the absorber layer is made of a material containing tantalum (Ta) as the main component.

In the EUV mask blank of the present invention, it is preferred that the etching selectivity between the protective layer and the absorber layer when subjected to dry etching using a chlorine-type gas as the etching gas, is at least 10.

In the EUV mask blank of the present invention, it is preferred that a low reflective layer to an inspection light to be used for inspection of a mask pattern, made of a material containing tantalum (Ta) as the main component, is formed on the absorber layer.

In the case where a low reflective layer is formed on the absorber layer, it is preferred that the contrast between reflected light on the surface of the protective layer and reflected light on the surface of the low reflective layer, to the wavelength of light to be used for inspection of a pattern formed in the absorber layer, is at least 30%.

Further, the present invention provides a reflective mask for EUV lithography (hereinafter referred to also as an "EUV mask of the present invention") obtained by patterning the above EUV mask blank of the present invention.

Further, the present invention provides a process for producing a semiconductor integrated circuit, which comprises subjecting an object to be exposed to exposure by means of the above EUV mask of the present invention to produce a semiconductor integrated circuit.

Further, the present invention provides a process for producing a reflective layer-equipped substrate for EUV lithography (hereinafter referred to also as EUVL), which comprises forming a multilayer reflective film for reflecting EUV light on a film-forming surface of a substrate and then, forming a protective layer for protecting the multilayer reflective film, on the multilayer reflective film, to produce a reflective layer-equipped substrate for EUVL, wherein the multilayer reflective film is a Mo/Si multilayer reflective film, the protective layer is a Ru layer or a Ru compound layer, and after forming the Mo/Si multilayer reflective film, the surface of a Si layer as the uppermost layer of the Mo/Si multilayer reflective film is exposed to a nitrogen-containing atmosphere without exposing it to the atmospheric air, and then, the protective layer is formed.

In the process for producing a reflective layer-equipped substrate for EUVL of the present invention, it is preferred that the product of the nitrogen partial pressure (Torr) of the nitrogen-containing atmosphere and the exposure time (s) is at least $1 \times 10^{-6}$ Torr·s ($=1.33 \times 10^{-4}$ Pa·s)=1 L (Langmuir), and the temperature of the nitrogen-containing atmosphere is from 0 to 170° C.

In the process for producing a reflective layer-equipped substrate for EUVL of the present invention, it is preferred that the temperature of the nitrogen-containing atmosphere is from 0 to 160° C.

In the process for producing a reflective layer-equipped substrate for EUVL of the present invention, it is preferred that the temperature of the nitrogen-containing atmosphere is from 0 to 150° C.

In the process for producing a reflective layer-equipped substrate for EUVL of the present invention, it is preferred that when the surface of the Si layer is exposed to the nitrogen-containing atmosphere, the nitrogen-containing atmosphere is maintained to be in a plasma state, or the surface of the Si layer is subjected to thermal treatment, or the surface of the Si layer is irradiated with ultraviolet rays, in order to accelerate incorporation of nitrogen to the surface of the Si layer.

Advantageous Effects of Invention

In the reflective layer-equipped substrate of the present invention and the EUV mask blank employing such a reflective layer-equipped substrate, deterioration in the EUV light reflectivity due to oxidation of the Ru protective layer is prevented. And, by prevention of the progress with time of deterioration in the EUV light reflectivity during the EUV exposure, it becomes unnecessary to change the exposure conditions in a half way, and it is possible to prolong the useful life of the photomask.

Further, the EUV mask prepared by employing the EUV mask blank of the present invention, is a highly reliable EUV mask, whereby a change with time of the EUV light reflectivity is little during the EUV exposure.

DESCRIPTION OF EMBODIMENTS

Now, the present invention will be described with reference to the drawings.

Figure 1:
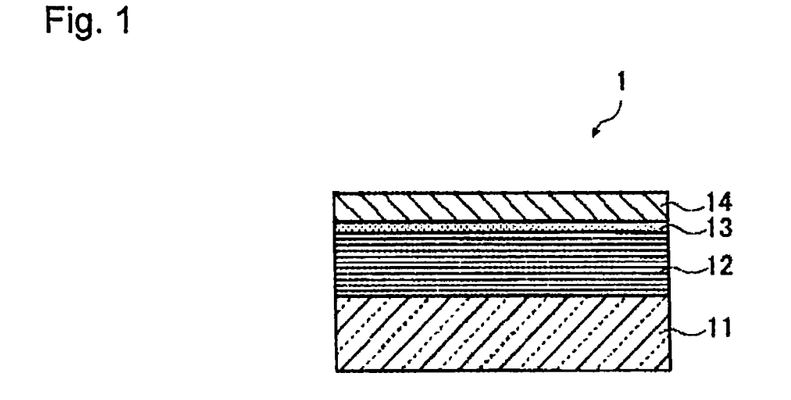
FIG. 1 is a schematic cross-sectional view illustrating an embodiment of the EUV mask blank of the present invention.

FIG. 1 is a schematic cross-sectional view illustrating one embodiment of the EUV mask blank of the present invention. A mask blank 1 shown in FIG. 1 has a reflective layer 12 to reflect EUV light and a protective layer 14 to protect the reflective layer 12 formed in this order on a substrate 11. However, in the EUV mask blank of the present invention, an intermediate layer 13 containing the after-mentioned prescribed amounts of nitrogen and Si, is formed between the reflective layer 12 and the protective layer 14. An absorber layer 15 is formed on the protective layer 14.

Now, the respective constituting elements of the mask blank 1 will be described.

The substrate 11 satisfies the properties as a substrate for an EUV mask blank.

Therefore, it is important that the substrate 11 has a low thermal expansion coefficient. Specifically, the thermal expansion coefficient of the substrate 11 is preferably $0\pm1.0\times10^{-7}/°$ C., more preferably $0\pm0.3\times10^{-7}/°$ C., further preferably $0\pm0.2\times10^{-7}/°$ C., still further preferably $0\pm0.1\times10^{-7}/°$ C., particularly preferably $0\pm0.05\times10^{-7}/°$ C. Further, the substrate is preferably one excellent in smoothness, planarity and durability against a cleaning liquid to be used for e.g. cleaning of a mask blank or a photomask after forming a pattern. As the substrate 11, specifically, glass having a low thermal expansion coefficient, e.g. $SiO_2$—$TiO_2$ type glass, may be used. However, the substrate is not limited thereto, and it is possible to employ a substrate of e.g. crystallized glass having β-quartz solid solution precipitated, quartz glass, silicon or metal. Further, a film such as a stress-correcting film may be formed on the substrate 11.

The substrate 11 preferably has a smooth surface having a surface roughness rms of at most 0.15 nm and a planarity of at most 100 nm, whereby a high reflectivity and transfer precision can be attained by a photomask after forming a pattern.

The size, thickness, etc. of the substrate 11 are suitably determined depending upon e.g. the designed values for the mask. In Examples given hereinafter, a $SiO_2$—$TiO_2$ type glass having a size of 6 inch (152.4 mm) square and a thickness of 0.25 inch (6.3 mm) was used.

It is preferred that no defect is present on the surface of the substrate 11 on the side where a multilayer reflective film 12 is to be formed. However, even in a case where a defect is present, in order not to cause a phase defect due to a concave defect and/or a convex defect, it is preferred that the depth of a concave defect or the height of a convex defect is not more than 2 nm, and the half value width of such a concave defect or convex defect is not more than 60 nm.

The property particularly required for the reflective layer 12 of the EUV mask blank is a high EUV light reflectivity. Specifically, when light ray within an EUV wavelength region is applied at an incident angle of 6° to the surface of the reflective layer 12, the maximum value of the reflectivity of the light ray in the vicinity of a wavelength of 13.5 nm is preferably at least 60%, more preferably at least 65%. Further, even in a case where an intermediate layer 13 and a protective layer 14 are formed on the reflective layer 12, the maximum value of the reflectivity of light ray in the vicinity of a wavelength of 13.5 nm is preferably at least 60%, more preferably at least 65%.

As a reflective layer for an EUV mask blank, a multilayer reflective film having a high refractive index layer and a low refractive index layer alternately laminated plural times is widely used, since a high reflectivity can thereby be accomplished in the EUV wavelength region.

In the EUV mask blank of the present invention, it is preferred to employ a Mo/Si multilayer reflective film having a Mo layer as a low refractive index layer and a Si layer as a high refractive index layer alternately laminated plural times.

In such a Mo/Si multilayer reflective film, it is preferred that the uppermost layer of the laminated Mo/Si multilayer reflective film is made to be a Si film.

In the case of the Mo/Si multilayer reflective film, in order to obtain a reflective layer 12 having the maximum value of the EUV light reflectivity being at least 60%, a Mo layer having a thickness of 2.3±0.1 nm and a Si layer having a thickness of 4.5±0.1 nm may be laminated repeatedly so that the number of repeating units becomes from 30 to 60.

Here, each layer constituting the Mo/Si multilayer reflective film may be formed to have a desired thickness by means of a well-known film-forming method such as a magnetron sputtering method or an ion beam sputtering method. For example, in the case of forming a Mo/Si multilayer reflective film by means of an ion beam sputtering method, it is preferred that a Mo layer is formed on the substrate to have a thickness of 2.3 nm at an ion accelerating voltage of from 300 to 1,500 V and a film-deposition rate of 0.03 to 0.30 nm/sec by using a Mo target as the target and an Ar gas (gas pressure: $1.3\times10^{-2}$ Pa to $2.7\times10^{-2}$ Pa) as the sputtering gas, and then a Si layer is formed to have a thickness of 4.5 nm at an ion accelerating voltage of from 300 to 1,500 V and a film-deposition rate of from 0.03 to 0.30 nm/sec by using a Si target as the target and an Ar gas (gas pressure: $1.3\times10^{-2}$ Pa to $2.7\times10^{-2}$ Pa) as the sputtering gas. When this operation is taken as one cycle, the Mo/Si multilayer reflective film is formed by laminating the Mo layer and the Si layer by from 40 to 50 cycles.

There may be a phenomenon wherein some of elements constituting the Mo layers and the Si layers constituting the Mo/Si multilayer reflective film diffuse into the adjacent layer thereby to deteriorate the reflectivity, i.e. a case where deterioration of the reflectivity due to interdiffusion becomes problematic. However, as a result of a study made by the present inventors, it has been found that the main factor of deterioration of the reflectivity is acceleration of oxidation from the upper portion of the EUV mask blank rather than diffusion of Si into the protective layer from the Si layer as the uppermost layer of the multilayer reflective film, i.e. it is mainly due to oxidation from the upper side film rather than the Mo/Si multilayer reflective film. Thus, it has been found that in order to prevent the deterioration of the reflectivity due to oxidation, it is sufficient to prevent the oxidation from the upper layer of the Mo/Si multilayer reflective film, i.e. from the protective layer, and thus the present invention has been accomplished.

In the EUV mask blank of the present invention, deterioration in the EUV light reflectivity due to oxidation of the Ru protective layer is prevented by forming an intermediate layer 13 containing from 0.5 to 25 at % of nitrogen and from 75 to 99.5 at % of Si, between the reflective layer 12 and the protective layer 14. The reason as to why deterioration in the EUV light reflectivity due to oxidation of the Ru protective layer is prevented by forming the intermediate layer 13 having the above composition between the reflective layer 12 and the protective layer 14, is considered to be as follows.

By preliminarily incorporating nitrogen to the intermediate layer 13 in order to prevent deterioration in reflectivity due to inclusion of a large amount of oxygen by oxidation of the Ru protective layer in the Si film as the uppermost layer of the reflective layer 12, the intermediate layer 13 having the above composition is considered to have an effect to prevent oxidation and to secure a high reflectivity after the film formation. Thus, even in a situation where the Ru protective layer is likely to be oxidized in a step to be carried out during the production of the mask blank or a step to be carried out during the production of a photomask from the mask blank (such as in each step of cleaning, defect inspection, heating, dry etching, defect correction or the like) or during the EUV exposure, by the presence of the intermediate layer 13 having the effect to prevent oxidation, oxidation of the Mo/Si multilayer reflective film present beneath the intermediate layer 13, more specifically, oxidation of the Si layer as the uppermost layer of the Mo/Si multilayer reflective film, is considered to be prevented, and as a result, deterioration in the EUV light reflectivity due to oxidation of the Ru protective layer, is considered to be prevented.

Here, by forming the intermediate layer 13 between the reflective layer 12 (Mo/Si multilayer reflective film) and the protective layer 14 (Ru protective layer), it is also possible to prevent diffusion of Si in the Si layer as the uppermost layer of the Mo/Si multilayer reflective film into the Ru protective layer during the formation of the protective layer 14.

If the content of nitrogen in the intermediate layer 13 is less than 0.5 at %, it is likely that the above-described effect to prevent further oxidation tends to be inadequate, whereby it is likely that the effect to prevent deterioration in the EUV light reflectivity due to oxidation of the Ru protective layer tends to be inadequate.

As described in detail hereinafter, in the present invention, the intermediate layer 13 having the above composition can be formed in such a manner that after forming the Mo/Si multilayer reflective film, the surface of the Si layer as the uppermost layer of the Mo/Si multilayer reflective film is exposed to a nitrogen-containing atmosphere. Nitrogen is considered to be incorporated either during the film formation of the Si layer as the uppermost layer of the Mo/Si multilayer reflective film, or during the film formation of the protective layer 14 to be formed on the intermediate layer 13, or during the film formation of both. However, if the intermediate layer is formed under such a condition that the content of nitrogen in the intermediate layer 13 exceeds 25 at %, the film having the nitrogen thus incorporated is likely to have defects increased during the film formation, thus leading to a problem.

The intermediate layer 13 contains preferably from 0.5 to 15 at % of nitrogen and from 85 to 99.5 at % of Si, more preferably from 0.5 to 10 at % of nitrogen and from 80 to 99.5 at % of Si, further preferably from 1 to 9 at % of nitrogen and from 91 to 99 at % of Si, further preferably from 3 to 9 at % of nitrogen and from 91 to 97 at % of Si, particularly preferably from 5 to 8 at % of nitrogen and from 92 to 95 at % of Si.

The intermediate layer 13 preferably contains no fluorine, since otherwise, Si in the intermediate layer 13 is likely to be eroded. Further, the intermediate layer 13 preferably contains no carbon or hydrogen, since if carbon or hydrogen is contained in the intermediate layer 13, it is likely to react with oxygen in the intermediate layer 13, whereby oxygen is discharged in the intermediate layer 13 to deteriorate the structure of the intermediate layer 13. For these reasons, the contents of fluorine, carbon and hydrogen in the intermediate layer 13 are preferably at most 3 at %, more preferably at most 1 at %, respectively. Further, likewise, the content of an element such as Ni, Y, Ti, La, Cr or Rh in the intermediate layer 13, is preferably at most 3 at %, more preferably at most 1 at %, by the total content of these elements, in order to prevent an increase of the surface roughness due to differences in the etching rates when the mask blank is subjected to etching.

Further, the content of oxygen in the intermediate layer 13 is also preferably at most 3 at %, more preferably at most 1 at %.

In the present invention, the thickness of the intermediate layer 13 is preferably from 0.2 to 2.5 nm, more preferably from 0.4 to 2 nm, further preferably from 0.5 to 1.5 nm, from the viewpoint of the effect to prevent deterioration in the EUV light reflectivity due to oxidation of the Ru protective layer. Further, the thickness of the Si layer as the uppermost layer of the multilayer reflective film is preferably from 2 to 4.8 nm, more preferably from 2.5 to 4.5 nm, particularly preferably from 3.0 to 4 nm, in order to form the intermediate layer 13 by exposing it to the nitrogen-containing atmosphere.

In the present invention, after forming the Mo/Si multilayer reflective film, the intermediate layer 13 having the above composition can be formed by exposing the surface of the Si layer as the uppermost layer of the Mo/Si multilayer reflective film to a nitrogen-containing atmosphere without exposing it to the atmospheric air, thereby to slightly nitride the surface of the Si layer, i.e. to incorporate nitrogen to the surface of the Si layer. Here, in this specification, the nitrogen-containing atmosphere means a nitrogen gas atmosphere or a mixed gas atmosphere of nitrogen gas and an inert gas such as argon. In the case of such a mixed gas atmosphere, the nitrogen gas concentration in the atmosphere is preferably at least 20 vol %, more preferably at least 50 vol %, further preferably at least 80 vol %.

Here, after forming the Mo/Si multilayer reflective film, the surface of the Si layer as the uppermost layer of the Mo/Si multilayer reflective film is exposed to the nitrogen-containing atmosphere without exposing it to the atmospheric air, for such a reason that if the Si layer surface is exposed to the atmospheric air before exposing it to the nitrogen atmosphere, the Si layer surface is oxidized, and even if thereafter exposed to the nitrogen atmosphere, nitrogen cannot be incorporated to the Si layer surface by nitriding of the Si layer surface, whereby it is likely that it is not possible to form an intermediate layer 13 containing the prescribed amounts of nitrogen and Si.

In the present invention, the nitrogen-containing atmosphere to which the Si layer surface is exposed, is preferably such that the product of the nitrogen partial pressure (Torr) and the exposure time (s) is preferably at least $1 \times 10^{-6}$ Torr·s (=1 L (Langmuir)). In a case where the nitrogen partial pressure is represented by Pa, the product of the nitrogen partial pressure (Pa) of the nitrogen-containing atmosphere and the exposure time (s) is preferably at least $1.33 \times 10^{-4}$ Pa·s.

The product of the nitrogen partial pressure and the exposure time is an index showing a frequency of impingement of nitrogen in the nitrogen-containing atmosphere to the Si layer surface, and in this specification, it may sometimes be referred to as a "exposure amount of nitrogen". In order to form the intermediate layer 13 having the above composition by nitriding of the Si layer surface, such a value is preferably at least $1 \times 10^{-6}$ Torr·s (at least $1.33 \times 10^{-4}$ Pa·s), more preferably at least $1 \times 10^{-3}$ Torr·s (at least $1.33 \times 10^{-1}$ Pa·s), further preferably at least $1 \times 10^{-2}$ Torr·s (at least 1.33 Pa·s), further preferably at least $1 \times 10^{-1}$ Torr·s (at least 13.3 Pa·s).

Here, the nitrogen partial pressure in the nitrogen-containing atmosphere to which the Si layer surface is exposed, is preferably from $1 \times 10^{-4}$ Torr to 820 Torr (from $1.33 \times 10^{-2}$ Pa to 109.32 kPa).

Here, in a case where the nitrogen-containing atmosphere is a nitrogen gas atmosphere, the above nitrogen partial pressure means the atmosphere pressure of the nitrogen gas atmosphere.

In order to prevent oxidation of the Si layer surface, it is preferred that the oxygen concentration in the nitrogen-containing atmosphere to which the Si layer surface is exposed, is very low. Specifically, in a case where the nitrogen partial pressure in the nitrogen-containing atmosphere is within the above range, i.e. in a case where the nitrogen partial pressure in the nitrogen-containing atmosphere is from $1 \times 10^{-4}$ Torr to 820 Torr (from $1.33 \times 10^{-2}$ Pa to 109.32 kPa), it is preferred that the oxygen partial pressure in the atmosphere is at most $1 \times 10^{-6}$ Torr ($1.33 \times 10^{-4}$ Pa).

Further, in order to prevent oxidation of the Si layer surface, it is preferred that the concentration of a gas component comprising $O_3$, $H_2O$ and a compound containing an OH group in the nitrogen-containing atmosphere to which the Si layer surface is exposed, is also very low. Specifically, in a case where the nitrogen partial pressure in the nitrogen-containing atmosphere is within the above range, i.e. in a case where the nitrogen partial pressure in the nitrogen-containing atmosphere is from $1 \times 10^{-4}$ Torr to 820 Torr (from $1.33 \times 10^{-2}$ Pa to 109.32 kPa), the partial pressure of the gas component comprising $O_3$, $H_2O$ and a compound containing an OH group in the atmosphere is preferably at most $1 \times 10^{-6}$ Torr ($1.33 \times 10^{-4}$ Pa), respectively.

Further, the concentration of $F_2$ in the nitrogen-containing atmosphere is also preferably very low, since otherwise the Si layer is likely to be thereby eroded. Specifically, in a case where the nitrogen partial pressure in the nitrogen-containing atmosphere is within the above range, i.e. in a case where the nitrogen partial pressure in the nitrogen-containing atmosphere is from $1 \times 10^{-4}$ Torr to 820 Torr (from $1.33 \times 10^{-2}$ Pa to 109.32 kPa), the partial pressure of $F_2$ in the atmosphere is preferably at most $1 \times 10^{-6}$ Torr.

In the present invention, the temperature of the nitrogen-containing atmosphere to which the Si layer surface is exposed, is preferably from 0 to 170° C. If the temperature of the nitrogen-containing atmosphere is less than 0° C., a problem of an influence due to adsorption of the residual moisture in vacuum is likely to occur. If the temperature of the nitrogen-containing atmosphere exceeds 170° C., it is likely that nitriding of the Si layer proceeds excessively, thus leading to deterioration in the EUV light reflectivity of the Mo/Si multilayer reflective film.

The temperature of the nitrogen-containing atmosphere is more preferably from 10 to 160° C., further preferably from 20 to 150° C., further preferably from 20 to 140° C., further preferably from 20 to 120° C.

Further, as described hereinafter, at the time of exposing the Si layer surface to the nitrogen-containing atmosphere, the Si layer surface may be thermally treated within the above temperature range.

In the present invention, by forming the intermediate layer 13 by exposing the surface of the Si layer as the uppermost layer of the Mo/Si multilayer reflective film to the nitrogen-containing atmosphere to slightly nitride the Si layer i.e. to incorporate nitrogen in the Si layer surface, it is possible to improve the durability against oxidation without deterioration in the EUV light reflectivity after the film formation of the protective layer 14 (Ru protective layer), such being desirable.

In Examples 1 and 2 given hereinafter, the time for exposing the Si layer surface to the nitrogen-containing atmosphere is set to be 600 sec and 6,000 sec, respectively, but the time for exposing the Si layer surface to the nitrogen-containing atmosphere is not limited thereto and may suitably be selected within a range to satisfy the above-described conditions relating to the nitrogen-containing atmosphere.

Further, as in the procedure shown in Examples 3 and 4, after forming the Mo/Si multilayer reflective film, at the time of exposing the surface of the Si layer as the uppermost layer of the Mo/Si multilayer reflective film to the nitrogen-containing atmosphere without exposing it to the atmospheric air, thermal treatment may be carried out in the nitrogen-containing atmosphere to form the intermediate layer 13. By subjecting the surface of the Si layer as the uppermost layer of the Mo/Si multilayer reflective film to such thermal treatment at the time of exposing it to the nitrogen atmosphere, nitriding of the Si layer surface i.e. incorporation of nitrogen into the Si layer surface, is accelerated.

Here, in order to carry out, after forming the Mo/Si multilayer reflective film, thermal treatment of the surface of the Si layer as the uppermost layer of the Mo/Si multilayer reflective film in the nitrogen-containing atmosphere without exposing it to the atmospheric air, after the formation of the Si layer, while maintaining the substrate having the Mo/Si multilayer reflective film formed thereon, in the film-forming chamber wherein the Si layer has been formed or in a chamber adjacent to such a film-forming chamber, the gas in the chamber is replaced with nitrogen gas (or a mixed gas of nitrogen gas with an inert gas such as argon), and the Si layer may be thermally treated in such a replaced gas.

The thermal treatment temperature at the time of thermally treating the Si layer surface in the nitrogen-containing atmosphere, is preferably from 120 to 160° C., particularly preferably from 130 to 150° C.

Like in the procedure shown in Examples 1 to 4, the procedure for exposing in the reduced-pressure atmosphere the Si layer surface to the nitrogen gas or to the mixed gas of nitrogen gas with an inert gas such as argon, is preferably such that in a case where film forming of the multilayer reflective film and the film forming of the protective layer are carried out in the same chamber, it is important to evacuate the nitrogen gas (or the mixed gas of nitrogen gas with an inert gas such as argon) after carrying out the procedure for exposing the Si layer surface to the nitrogen gas (or to the mixed gas of nitrogen gas with an inert gas such as argon) and before carrying out the film formation of the protective layer. Further, this procedure is preferred also in that it is possible to control the nitrogen content in the intermediate layer 13 by controlling the exposure amount of the nitrogen gas (or the mixed gas of nitrogen gas with an inert gas such as argon) to the Si layer surface.

It has been mentioned above that like in the procedure shown in Examples 3 and 4, after forming the Mo/Si multilayer reflective film, by subjecting the surface of the Si layer as the uppermost layer of the Mo/Si multilayer reflective film to thermal treatment with the nitrogen-containing atmosphere at the time of exposing it to the nitrogen-containing atmosphere without exposing it to the atmospheric air, it is possible to accelerate nitriding of the Si layer surface i.e. incorporation of nitrogen into the Si layer surface. It is also preferred that in the case of exposing in the reduced pressure atmosphere the Si layer surface to the nitrogen gas or the mixed gas of nitrogen gas with an inert gas such as argon, the reduced pressure atmosphere is maintained in a plasma state in order to accelerate nitriding of the Si layer surface i.e. incorporation of nitrogen into the Si layer surface.

However, even in such a case, if the Si layer surface is ion-irradiated with nitrogen gas (or a mixed gas of nitrogen gas with an inert gas such as argon) ionized in a plasma state by application of a voltage, ionized nitrogen is likely to impinge on the Si layer surface in an accelerated state, whereby nitriding of the Si layer is likely to proceed excessively to cause deterioration in the EUV light reflectivity of the Mo/Si multilayer reflective film. Therefore, it is particularly preferred not to apply a voltage to the nitrogen gas (or the mixed gas of nitrogen gas with an inert gas such as argon) ionized in a plasma state, i.e. not to apply ion-irradiation, so that it is possible to control the amount of nitrogen in the intermediate layer 13 to be at a proper level.

Further, in a case where in a reduced pressure atmosphere, the Si layer surface is exposed to nitrogen gas or a mixed gas of nitrogen gas with an inert gas such as argon, it is also preferred that in the reduced pressure atmosphere, the Si layer surface is irradiated with ultraviolet rays, in order to accelerate nitriding of the Si layer surface i.e. incorporation of nitrogen into the Si layer surface.

The protective layer 14 is provided for the purpose of protecting the reflective layer 12, so that at the time of forming a pattern in the absorber layer 15 by an etching process, usually, by a dry etching process, the reflective layer 12 will not be damaged by the etching process. Accordingly, as the material for the protective layer 14, a material hardly susceptible to an influence by the etching process of the absorber layer 15 i.e. having an etching rate slower than the absorber layer 15 and hardly susceptible to damage by such an etching process, is selected for use.

Further, the protective layer 14 is preferably such that the protective layer 14 itself also has a high EUV light reflectivity in order not to impair the EUV light reflectivity at the reflective layer 12 even after forming the protective layer 14.

In the present invention, in order to satisfy the above conditions, as the protective layer 14, a Ru layer or a Ru compound layer may, for example, be formed. As such a Ru compound of the Ru compound layer, at least one member selected from the group consisting of RuB, RuNb and RuZr is preferred. In a case where the protective layer 14 is a Ru compound layer, the content of Ru is preferably at least 50 at %, more preferably at least 80 at %, particularly preferably at least 90 at %. However, in a case where the protective layer 14 is a RuNb layer, the content of Nb in the protective layer 14 is preferably from 5 to 40 at %, more preferably from 5 to 30 at %.

Although only slightly, Si is likely to diffuse into the protective layer 14 from the adjacent intermediate layer 13. In a case where the protective layer 14 contains Si diffused from the intermediate layer 13, the content of Si in the protective layer 14 is preferably from 0.1 to 4.5 at %, more preferably from 0.1 to 4 at %.

In a case where the protective layer 14 contains Si diffused from the intermediate layer 13, the composition may be such that the Si content in the protective layer 14 decreases as the distance from the intermediate layer 13 increases, i.e. the Si content in the protective layer 14 is inclined so that the Si content is high in the vicinity of the interface with the intermediate layer 13, and the Si content becomes low in the vicinity of the interface with the absorber layer 15. In the case of such an inclined composition, the Si content in the vicinity of the interface with the absorber layer 15 is preferably as low as possible, and specifically, it is preferably at most 4 at %, and it is more preferred that no Si is contained in the vicinity of the interface with the absorber layer 15.

Although only slightly, also nitrogen is likely to diffuse into the protective layer 14 from the adjacent intermediate layer 13. In a case where the protective layer 14 contains nitrogen diffused from the intermediate layer 13, the nitrogen content in the protective layer 14 is preferably from 0.1 to 10 at %, more preferably from 0.1 to 5 at %.

In a case where the protective layer 14 contains nitrogen diffused from the intermediate layer 13, the composition may be such that the nitrogen content in the protective layer 14 decreases as the distance from the intermediate layer 13 increases, i.e. the nitrogen content in the protective layer 14 is inclined so that the nitrogen content is high in the vicinity of the interface with the intermediate layer 13 and the nitrogen content becomes low in the vicinity of the interface with the absorber layer 15.

In the present invention, even if Si or nitrogen diffuses into the protective layer 14 from the adjacent intermediate layer 13 to some extent, the properties of the protective layer 14 may not be substantially deteriorated.

In the present invention, the surface roughness rms of the surface of the protective layer 14 is preferably at most 0.5 nm. If the surface roughness of the surface of the protective layer 14 is large, the surface roughness of the absorber layer 15 to be formed on the protective layer 14 tends to be large, whereby the edge roughness of a pattern to be formed in the absorber layer 15 tends to be large, and the dimensional precision of the pattern tends to be poor. As the pattern becomes fine, the influence of the edge roughness becomes distinct, and therefore, the surface of the absorber layer 15 is required to be smooth.

When the surface roughness rms of the surface of the protective layer 14 is at most 0.5 nm, the surface of the absorber layer 15 to be formed on the protective layer 14 will be sufficiently smooth, thus being free from deterioration of the dimensional precision of a pattern due to an influence of the edge roughness. The surface roughness rms of the surface of the protective layer 14 is more preferably at most 0.4 nm, further preferably at most 0.3 nm.

The thickness of the protective layer 14 is preferably from 1 to 10 nm, whereby the EUV light reflectivity can be increased and an etching resistant characteristic can be obtained. The thickness of the protective layer 14 is more preferably from 1 to 5 nm, further preferably from 2 to 4 nm.

The protective layer 14 may be formed by means of a well-known film forming method such as a magnetron sputtering method or an ion beam sputtering method.

In a case where a Ru layer is formed as the protective layer 14 by means of an ion beam sputtering method, discharge may be made in an argon (Ar) atmosphere by using a Ru target as the target.

Specifically, the ion beam sputtering may be carried out under the following conditions.

Sputtering gas: Ar (gas pressure: from $1.3\times10^{-2}$ Pa to $2.7\times10^{-2}$ Pa)
Ion accelerating voltage: from 300 to 1,500 V
Film forming rate: from 0.03 to 0.30 nm/sec Further, a state before forming an absorber layer of the EUV mask blank of the present invention, i.e. a structure excluding the absorber layer 15 from the mask blank 1 shown in FIG. 1, is the reflective layer-equipped substrate of the present invention. The reflective layer-equipped substrate of the present invention is one constituting a precursor for EUV mask blank.

The reflective layer-equipped substrate of the present invention is such that when the surface of the protective layer 14 is cleaned with ozone water in accordance with the procedure described in Examples given hereinafter, deterioration of EUV light reflectivity as between before and after the cleaning is at most 0.9%, more preferably at most 0.5%.

In a case where the reflective layer-equipped substrate of the present invention is thermally treated in accordance with the procedure described in Examples given hereinafter, deterioration in the EUV light reflectivity as between before and after the thermal treatment is preferably at most 7%, more preferably at most 6%.

Here, the reason as to why the value of deterioration in the EUV light reflectivity as between before and after the thermal treatment is large as compared with the deterioration in the EUV light reflectivity as between before and after the cleaning with ozone water is such that in Examples given hereinafter, in order to ascertain the effects by the present invention, thermal treatment was carried out under severer conditions than in the heating step which is carried out during the production of a mask blank or in the heating step which is carried out for the production of a photomask of the mask blank.

The property particularly required for the absorber layer 15 is that the EUV light reflectivity is very low. Specifically, when the surface of the absorber layer 15 is irradiated with light ray within a wavelength region of EUV light, the maximum light ray reflectivity in the vicinity of a wavelength of 13.5 nm is preferably at most 0.5%, more preferably at most 0.1%.

In order to attain such a property, it is preferably constituted by a material having a high absorption coefficient of EUV light, and it is preferably formed by a material containing tantalum (Ta) as the main component.

Such an absorber layer 15 is preferably a film containing Ta as the main component, and particularly, a film containing TaN or TaBN may be exemplified. As another example, one containing Ta, B, Si and nitrogen (N) in the following ratio (TaBSiN film) may be mentioned.

Content of B: at least 1 at % and less than 5 at %, preferably from 1 to 4.5 at %, more preferably from 1.5 to 4 at %.
Content of Si: from 1 to 25 at %, preferably from 1 to 20 at %, more preferably from 2 to 12 at %.
Compositional ratio (atomic ratio) of Ta to N (Ta:N): from 8:1 to 1:1.
Content of Ta: preferably from 50 to 90 at %, more preferably from 60 to 80 at %.
Content of N: preferably from 5 to 30 at %, more preferably from 10 to 25 at %.

The absorber layer 15 as in the above composition is amorphous in its crystal state and is excellent in the surface smoothness.

The absorber layer 15 having the above composition preferably has a surface roughness rms of at most 0.5 nm. If the surface roughness of the surface of the absorber layer 15 is large, the edge roughness of a pattern to be formed in the absorber layer 15 tends to be large, and the dimensional precision of the pattern tends to be poor. As the pattern becomes fine, the influence of the edge roughness becomes distinct, and therefore, the surface of the absorber layer 15 is required to be smooth.

When the surface roughness rms of the surface of the absorber layer 15 is at most 0.5 nm, the surface of the absorber layer 15 is sufficiently smooth and free from deterioration in the dimensional precision of a pattern due to an influence of the edge roughness. The surface roughness rms of the surface of the absorber layer 15 is more preferably at most 0.4 nm, further preferably at most 0.3 nm.

With the above-described structure, the absorber layer 15 has a high etching rate when dry etching is carried out by using a chlorine-type gas as the etching gas, and the etching selectivity to the protective layer 14 is at least 10. In this specification, the etching selectivity can be calculated by the following formula (1):

$$\text{Etching selectivity}=(\text{etching rate of absorber layer 15})/(\text{etching rate of protective layer 14}) \quad (1)$$

The etching selectivity is preferably at least 10, more preferably at least 11, further preferably at least 12.

The thickness of the absorber layer 15 is preferably from 50 to 100 nm. The absorber layer 15 having the above-described structure can be formed by using a film forming method such as a sputtering method, such as a magnetron sputtering method or an ion beam sputtering method.

Figure 2:
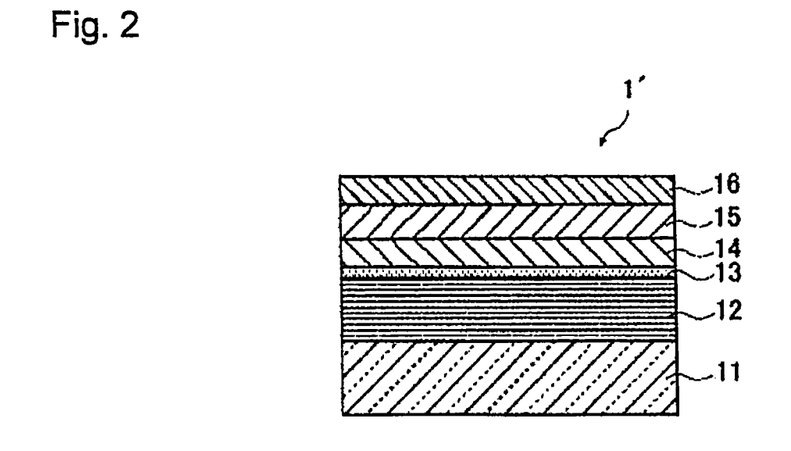
FIG. 2 is a schematic cross-sectional view illustrating an embodiment wherein a low reflective layer is formed on the absorber layer of the EUV mask blank in FIG. 1.

Like EUV mask blank 1' shown in FIG. 2, the EUV mask blank of the present invention is preferably such that a low reflective layer 16 to an inspection light to be used for inspection of a mask pattern is formed on the absorber layer 15.

At the time of preparing an EUV mask, after forming a pattern in the absorber layer, an inspection is conducted to see if the pattern is formed as designed. In such an inspection of a mask pattern, an inspecting machine is used wherein light having a wavelength of about 257 nm is usually used as the inspection light. That is, the inspection is made by a difference in the reflectivity of such light having a wavelength of about 257 nm, specifically by the difference in the reflectivity between the surface exposed by removal of the absorber layer 15 by the formation of a pattern and the surface of the absorber layer 15 remained without being removed by the formation of the pattern. Here, the former is the surface of the protective layer 14. Therefore, if the difference in the reflectivity between the surface of the protective layer 14 and the surface of the absorber layer 15 to the wavelength of the inspection light is small, the contrast at the time of the inspection becomes poor, and an accurate inspection may not be done.

The absorber layer 15 having the above-described structure has a very low EUV light reflectivity and has an excellent property as an absorber layer for an EUV mask blank, but when viewed with respect to the wavelength of the inspection light, the light reflectivity may not be necessarily sufficiently low. As a result, the difference between the reflectivity at the surface of the absorber layer 15 and the reflectivity at the surface of the protective layer 14 at the wavelength of the inspection light tends to be small, and the contrast at the time of the inspection may not sufficiently be obtainable. If the contrast at the time of the inspection cannot be sufficiently obtained, a defect in a pattern cannot sufficiently be detected in the inspection of a mask, and an adequate inspection of a defect may not be carried out.

Like EUV mask blank 1' shown in FIG. 2, by forming a low reflective layer 16 on the absorber layer 15, the contrast at the time of the inspection will be good. In other words, the light reflectivity at a wavelength of the inspection light becomes very low. When irradiated with light ray within the wavelength region of the inspection light, the low reflective layer 16 to be formed for such a purpose preferably has the maximum light reflectivity at the wavelength of the inspection light being at most 15%, more preferably at most 10%, further preferably at most 5%.

When the light reflectivity at the wavelength of the inspection light at the low reflective layer 16 is at most 15%, the contrast at the time of the inspection is good. Specifically, the contrast between reflected light with a wavelength of the inspection light at the surface of the protective layer 14 and reflected light with the wavelength of the inspection light at the surface of the low reflective layer 16 becomes at least 30%, preferably at least 40%.

In this specification, the contrast can be obtained by using the following formula (2).

$$\text{Contrast (\%)} = ((R_2 - R_1)/(R_2 + R_1)) \times 100 \quad (2)$$

Figure 3:
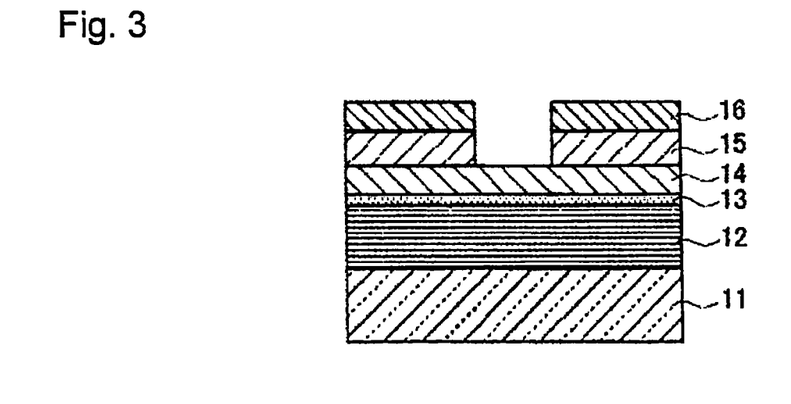
FIG. 3 is a schematic cross-sectional view illustrating an embodiment wherein a pattern is formed in the absorber layer 15 and the low reflective layer 16 of the EUV mask blank 1' in FIG. 2.

Here, $R_2$ at the wavelength of the inspection light is the reflectivity at the surface of the protective layer 14, and $R_1$ is the reflectivity at the surface of the low reflective layer 16. Here, the above $R_1$ and $R_2$ are measured in such a state as shown in FIG. 2 wherein a pattern is formed in the absorber layer 15 and the low reflective layer 16 of the EUV mask blank 1' (i.e. in the state as shown in FIG. 3). The above $R_2$ is a value measured at the surface of the protective layer 14 exposed as the absorber layer 15 and the low reflective layer 16 were removed by formation of a pattern, as shown in FIG. 3, and $R_1$ is a value measured at the surface of the low reflective layer 16 remained without being removed by the formation of the pattern.

In the present invention, the contrast represented by the above formula is more preferably at least 45%, further preferably at least 60%, particularly preferably at least 80%.

To attain the above-described properties, the low reflective layer 16 is preferably constituted by a material having a refractive index lower than the absorber layer 15 at the wavelength of the inspection light, and its crystal state is preferably amorphous. As a specific example of such a low reflective layer 16, a film containing Ta and oxygen as the main components is preferred, and particularly, a film containing TaNO or TaBNO as the main component may be exemplified. As another example, one containing Ta, B, Si and oxygen (O) in the following ratio (low reflective layer (TaBSiO)) may be mentioned.

Content of B: at least 1 at % and less than 5 at %, preferably from 1 to 4.5 at %, more preferably from 1.5 to 4 at %.
Content of Si: from 1 to 25 at %, preferably from 1 to 20 at %, more preferably from 2 to 10 at %.
Compositional ratio (atomic ratio) of Ta to O (Ta:O): from 7:2 to 1:2, preferably from 7:2 to 1:1, more preferably from 2:1 to 1:1.

Further, as a specific example for the low reflective layer 16, one containing Ta, B, Si, O and N in the following ratio (low reflective layer (TaBSiON)) may be mentioned.

Content of B: at least 1 at % and less than 5 at %, preferably from 1 to 4.5 at %, more preferably from 2 to 4.0 at %.
Content of Si: from 1 to 25 at %, preferably from 1 to 20 at %, more preferably from 2 to 10 at %.
Compositional ratio (atomic ratio) of Ta to O and N (Ta:(O+N)): from 7:2 to 1:2, preferably from 7:2 to 1:1, more preferably from 2:1 to 1:1.

With the above-described structure, the low reflective layer ((TaBSiO) or (TaBSiON)) is amorphous in its crystal state and is excellent in its surface smoothness. Specifically, the surface roughness rms of the low reflective layer ((TaBSiO) or (TaBSiON)) is preferably at most 0.5 nm.

As mentioned above, in order to prevent deterioration in the dimensional stability of a pattern due to an influence of the edge roughness, the surface of the absorber layer 15 is required to be smooth. The low reflective layer 16 is formed on the absorber layer 15, and for the same reason, its surface is required to be smooth.

When the surface roughness rms of the surface of the low reflective layer 16 is at most 0.5 nm, the surface of the low reflective layer 16 is sufficiently smooth and free from deterioration in the dimensional precision of a pattern due to an influence of the edge roughness. The surface roughness rms of the surface of the low reflective layer 16 is more preferably at most 0.4 nm, further preferably at most 0.3 nm.

In a case where the low reflective layer 16 is formed on the absorber layer 15, the total thickness of the absorber layer 15 and the low reflective layer 16 is preferably from 55 to 130 nm. Further, if the thickness of the low reflective layer 16 is more than the thickness of the absorber layer 15, the EUV absorbing property at the absorber layer 15 is likely to be low, and therefore, the thickness of the low reflective layer 16 is preferably less than the thickness of the absorber layer 15. For this purpose, the thickness of the low reflective layer 16 is preferably from 5 to 30 nm, more preferably from 10 to 20 nm.

The low reflective layer ((TaBSiO) or (TaBSiON)) may be formed by using a film forming method such as a sputtering method, such as a magnetron sputtering method or an ion beam sputtering method.

Here, the reason as to why it is preferred to form a low reflective layer 16 on the absorber layer 15 as in the EUV mask blank 1' shown in FIG. 2, is that the wavelength of the inspection light for a pattern is different from the wavelength of EUV light. Therefore, in a case where EUV light (in the vicinity of 13.5 nm) is used as the inspection light for a pattern, it is considered unnecessary to form a low reflective layer 16 on the absorber layer 15. The wavelength of the inspection light tends to shift toward a low wavelength side as the size of a pattern becomes small, and in future, it is considered to be shifted to 193 nm or further to 13.5 nm. In the case where the wavelength of the inspection light is 13.5 nm, it is considered unnecessary to form a low reflective layer 16 on the absorber layer 15.

The EUV mask blank of the present invention may have a functional film known in the field of EUV mask blanks, in addition to the reflective layer 12, intermediate layer 13, protective layer 14, absorber layer 15 and low reflective layer 16. A specific example of such a functional film may, for example, be a high dielectric constant coating formed on the rear side of the substrate to promote the electrostatic chucking of the substrate, as disclosed in e.g. JP-A-2003-501823 (which is incorporated in this specification by reference). Here, the rear side of the substrate means the surface on the opposite side to the side where the reflective layer 12 is formed. For the high dielectric constant coating to be formed on the rear side of the substrate for such a purpose, the electrical conductivity and the thickness of the constituting material are selected so that the sheet resistance will be at most 100Ω/□. The constituting material of the high dielectric constant coating may be selected widely from those disclosed in known literatures. For example, a high dielectric constant coating disclosed in JP-A-2003-501823, specifically a coating comprising silicon, TiN, molybdenum, chromium and TaSi may be applied. The thickness of the high dielectric constant coating may, for example, be from 10 to 1,000 nm.

The high dielectric constant coating may be formed by means of a sputtering method such as a magnetron sputtering method or an ion beam sputtering method, a CVD method, a vacuum vapor deposition method or an electroplating method.

Further, the present invention provides, in addition to the above-described reflective film-equipped substrate for EUV lithography and the reflective mask blank for EUV lithography, an EUV mask having a pattern formed on such an EUV mask blank.

The EUV mask of the present invention may be produced by patterning at least the absorber layer of the EUV mask blank of the present invention (in a case where a low reflective layer is formed on the absorber layer, the absorber layer and the low reflective layer). The method for patterning the absorber layer (in a case where a low reflective layer is formed on the absorber layer, the absorber layer and the low reflective layer), is not particularly limited. For example, a method may be employed wherein a resist is applied on the absorber layer (in a case where a low reflective layer is formed on the absorber layer, the absorber layer and the low reflective layer) to form a resist pattern, and by using it as a mask, the absorber layer (in a case where a low reflective layer is formed on the absorber layer, the absorber layer and the low reflective layer) is subjected to etching. The material for the resist, or the drawing method for the resist pattern may suitably be selected in consideration of e.g. the material of the absorber layer (in a case where a low reflective layer is formed on the absorber layer, the absorber layer and the low reflective layer). Also, the method for etching the absorber layer (in a case where a low reflective layer if formed on the absorber layer, the absorber layer and the low reflective layer) is not particularly limited, and dry etching such as reactive ion etching, or wet etching may be employed. After patterning the absorber layer (in a case where a low reflective layer is formed on the absorber layer, the absorber layer and the low reflective layer), the resist is removed by a remover liquid to obtain the EUV mask of the present invention.

A process for producing a semiconductor integrated circuit using the EUV mask according to the present invention will be described. The present invention may be applied to a process for producing a semiconductor integrated circuit by means of a photolithography method using EUV light as the light source for exposure. Specifically, a substrate such as a silicon wafer coated with a resist is disposed on a stage, and the above EUV mask is set on a reflective exposure apparatus combined with a reflective mirror. And, EUV light from a light source is applied to the EUV mask via the reflective mirror to have the EUV light reflected by the EUV mask and is applied to the substrate coated with the resist. By such a pattern transfer step, a circuit pattern is transferred to the substrate. The substrate having a circuit pattern transferred thereto is subjected to etching of sensitized or non-sensitized portions by development, followed by peeling of the resist. A semiconductor integrated circuit is produced by repeating such a process.

EXAMPLES

Now, the present invention will be described in further detail with reference to Examples.

Example 1

In this Example, a mask blank 1' as shown in FIG. 2 is prepared.

As a substrate 11 for film formation, a $SiO_2$—$TiO_2$ type glass substrate (size: 6 inches (152.4 mm) square, thickness: 6.3 mm) was used. The thermal expansion coefficient of this glass substrate was $0.2 \times 10^{-7}$/° C., the Young's modulus was 67 GPa, the Poisson ratio was 0.17, and the specific rigidity was $3.07 \times 10^7$ m$^2$ s$^2$. This glass substrate was polished to form a smooth surface having a surface roughness rms of at most 0.15 nm and a planarity of at most 100 nm.

On the rear surface side of the substrate 11, a Cr film having a thickness of 100 nm was formed by a magnetron sputtering method to provide a high dielectric constant coating (not shown in the drawings) having a sheet resistance of 100Ω/□.

By using the formed Cr film, the substrate 11 (size: 6 inches (152.4 mm) square, thickness: 6.3 mm) was fixed to a usual electrostatic chuck of a flat plate shape, and on the surface of the substrate 11, a Mo layer and then a Si layer were alternately formed by means of an ion beam sputtering method for 50 cycles to form a Mo/Si multilayer reflective film (reflective layer 12) having a total thickness of 340 nm ((2.3 nm+4.5 nm)×50). Here, the uppermost layer of the multilayer reflective film 12 is a Si layer.

The film forming conditions for the Mo layer and the Si layer are as follows.
(Film Forming Conditions for Mo Layer)
  Target: Mo target
  Sputtering gas: Ar gas (gas pressure: 0.02 Pa)
  Voltage: 700 V
  Film forming rate: 0.064 nm/sec
  Film thickness: 2.3 nm
(Film Forming Conditions for Si Layer)
  Target: Si target (boron-doped)
  Sputtering gas: Ar gas (gas pressure: 0.02 Pa)
  Voltage: 700 V
  Film forming rate: 0.077 nm/sec
  Film thickness: 4.5 nm Then, the surface of the Si layer as the uppermost layer of the Mo/Si multilayer reflective film was exposed to a nitrogen-containing atmosphere under the following conditions.
(Exposure Conditions)
  Carrier gas: Ar gas, flow rate: 17 sccm
  Exposure gas: nitrogen gas, flow rate: 50 sccm
    (during RF discharge, nitrogen gas and carrier gas were supplied)
  Nitrogen gas partial pressure: 0.2 mTorr ($2.6 \times 10^{-2}$ Pa)
  Atmosphere pressure: 0.3 mTorr ($3.5$ Torr$\times 10^{-2}$ Pa)
  Atmosphere temperature: 20° C.
  Exposure time: 600 sec
  Exposure amount: $1.2 \times 10^5$ L (1 L (Langmuir)=$1 \times 10^{-6}$ Torr·s=$1.33 \times 10^{-4}$ Pa·s)
  Frequency of RF discharge: 1.8 MHz
  RF power: 500 W Then, a Ru layer as the protective layer 14 was formed by using an ion beam sputtering method.

The conditions for forming the protective layer 14 are as follows.
  Target: Ru target
  Sputtering gas: Ar gas (gas pressure: 0.02 Pa)
  Voltage: 700 V
  Film forming rate: 0.052 nm/sec
  Film thickness: 2.5 nm Then, on the protective layer 14, a TaBSiN layer is formed as an absorber layer 15 by means of a magnetron sputtering method.

The conditions for forming the TaBSiN layer are as follows.
(Film Forming Conditions for TaBSiN Layer)
  Target: TaBSi compound target (compositional ratio: Ta 80 at %, B 10 at %, Si 10 at %).
  Sputtering gas: mixed gas of Ar and $N_2$ (Ar: 86 vol %, $N_2$: 14 vol %, gas pressure: 0.3 Pa)
  Applied power: 150 W
  Film forming rate: 0.12 nm/sec
  Film thickness: 60 nm Then, on the absorber layer 15, a TaBSiON layer is formed as a low reflective layer 16 by means of a magnetron sputtering method, to obtain a mask blank 1' as shown in FIG. 2.

The conditions for forming the TaBSiON film are as follows.

(Film Forming Conditions for TaBSiON Layer)
- Target: TaBSi target (compositional ratio: Ta 80 at %, B 10 at %, Si 10 at %)
- Sputtering gas: mixed gas of Ar, $N_2$ and $O_2$ (Ar: 60 vol %, $N_2$: 20 vol %, $O_2$: 20 vol %, gas pressure: 0.3 Pa)
- Applied power: 150 W
- Film forming rate: 0.18 nm/sec
- Film thickness: 10 nm With respect to the mask blank obtained by the above procedure, the following evaluations are carried out.

(1) Film Composition

With respect to a sample formed up to the protective layer 14 by the above-described procedure, by measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it was confirmed that an intermediate layer 13 was formed between the protective layer 14 and the Si layer as the uppermost layer of the Mo/Si multilayer reflective film.

The composition of the intermediate layer 13 was such that nitrogen was 6 at %, and Si was 94 at %. Further, the thickness of the intermediate layer 13 was 1 nm.

(2) Surface Roughness

With respect to a sample formed up to the protective layer 14 by the above-described procedure, the surface roughness of the protective layer 14 was confirmed by means of an Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

With respect to a sample formed up to the protective layer 14 by the above-described procedure, the surface of the protective layer 14 was treated by spin cleaning with ozone water for a total of 600 seconds. Before and after this treatment, the EUV reflectivity was measured by means of an EUV reflectivity meter (MBR (tradename), manufactured by AIXUV) by applying EUV light (wavelength: 13.5 nm) to the surface of the protective layer 14. Deterioration in the EUV reflectivity as between before and after this treatment was 0.5%.

(4) Thermal Treatment Durability

To a sample formed up to the protective layer 14 by the above-described procedure, thermal treatment (in the atmospheric air) at 210° C. for 10 minutes was applied. As between before and after this treatment, deterioration in the EUV reflectivity was 4.1%.

(5) Reflection Properties (Evaluation of Contrast)

With respect to a sample formed up to the protective layer 14 by the above-described procedure, the reflectivity of a pattern inspection light (wavelength: 257 nm) at the surface of the protective layer 14 is measured by means of a spectrophotometer. Further, with respect to a sample formed up to the low reflective layer 16, the reflectivity of the pattern inspection light at the surface of the low reflective layer 16 is measured. As the results, the reflectivity at the surface of the protective layer 14 is 60.0%, and the reflectivity at the surface of the low reflective layer 16 is 6.9%. The contrast is obtained by using these results and the above-mentioned formula (2) and found to be 79.4%.

With respect to the obtainable EUV mask blank 1', the surface of the low reflective layer 16 is irradiated with EUV light (wavelength: 13.5 nm), whereby the reflectivity of EUV light is measured. As a result, the reflectivity of EUV light is 0.4%, whereby it is confirmed that the EUV absorption property is excellent.

(6) Etching Property

The etching property is evaluated by the following method instead of an evaluation by using an EUV mask blank prepared by the above-described procedure.

On a sample table (4 inches quartz substrate) of an RF plasma etching apparatus, a Si chip (10 mm×30 mm) having a Ru film or a TaBSiN film formed by the following method, is set as a sample. In this state, the Ru film or the TaNBSiN film of the Si chip set on the sample table is subjected to plasma RF etching under the following conditions.
- Bias RF: 50 W
- Etching time: 120 sec
- Trigger pressure: 3 Pa
- Etching pressure: 1 Pa
- Etching gas: $Cl_2$/Ar
- Gas flow rate ($Cl_2$/Ar): 20/80 sccm
- Electrode-substrate distance: 55 mm Film formation of the Ru film is carried out by an ion beam sputtering method under the following film forming conditions.

(Film Forming Conditions for Ru Film)
- Target: Ru target
- Sputtering gas: Ar gas (gas pressure: 2 mTorr, flow rate: 15 sccm)
- Output power: 150 W
- Film forming rate: 0.023 nm/sec
- Film thickness: 2.5 nm The TaBSiN film is formed by means of a magnetron sputtering method by simultaneously discharging a TaB target and a Si target in a nitrogen atmosphere. Here, the film formation is carried out under the following three conditions.

(Film Forming Condition (1) for TaBSiN Film)
- Target: TaB target (compositional ratio: Ta 80 at %, B 20 at %), Si target
- Sputtering gas: mixed gas of Ar and $N_2$ (Ar: 86 vol %, $N_2$: 14 vol %, gas pressure: 2 mTorr (0.3 Pa))
- Output power: 150 W (TaB target), 30 W (Si target)
- Film forming rate: 0.13 nm/sec
- Film thickness: 60 nm (Film Forming Condition (2) for TaBSiN Film)
- Target: TaB target (compositional ratio: Ta 80 at %, B 20 at %), Si target
- Sputtering gas: Ar gas, $N_2$ gas (Ar: 86 vol %, $N_2$: 14 vol %, gas pressure: 2 mTorr (0.3 Pa))
- Output power: 150 W (TaB target), 50 W (Si target)
- Film forming rate: 0.12 nm/sec
- Film thickness: 60 nm (Film Forming Condition (3) for TaBSiN Film)
- Target: TaB target (compositional ratio: Ta 80 at %, B 20 at %), Si target
- Sputtering gas: Ar gas, $N_2$ gas (Ar: 86 vol %, $N_2$: 14 vol %, gas pressure: 2 mTorr (0.3 Pa), flow rate: 13 sccm (Ar), 2 sccm ($N_2$))
- Output power: 150 W (TaB target), 100 W (Si target)
- Film forming rate: 0.11 nm/sec
- Film thickness: 60 nm With respect to the Ru film and the TaBSiN films (1) to (3) formed under the above conditions, etching rates are obtained, and the etching selectivity is obtained by using the following formula (3).

$$\text{Etching selectivity} = (\text{etching rate of TaBSiN film})/(\text{etching rate of Ru film}) \quad (3)$$

The etching selectivity to the protective layer 13 is preferably at least 10. The etching selectivities of the TaBSiN film (1) to (3) are as follows, and each has a sufficient selectivity.
TaBSiN film (1): 10.0
TaBSiN film (2): 12.3
TaBSiN film (3): 13.9

Example 2

Example 2 was carried out in the same procedure as in Example 1 except that the conditions for exposure to a nitrogen-containing atmosphere were changed to the following conditions.
(Exposure Conditions)
  Carrier gas: Ar gas, flow rate: 17 sccm
  Exposure gas: nitrogen gas, flow rate: 50 sccm
    (during RF discharge, nitrogen gas and carrier gas were supplied)
  Nitrogen gas partial pressure: 0.2 mTorr ($2.6 \times 10^{-2}$ Pa)
  Atmosphere pressure: 0.3 mTorr ($3.5 \times 10^{-2}$ Pa)
  Atmosphere temperature: 20° C.
  Exposure time: 6,000 sec
  Exposure amount: $1.2 \times 10^6$ L (1 L (Langmuir)=$1 \times 10^{-6}$ Torr·s=$1.33 \times 10^{-4}$ Pa·s)
  Frequency of RF discharge: 1.8 MHz
  RF power: 500 W With respect to the mask blank obtained in the above procedure, the following evaluations were carried out.
(1) Film Composition
With respect to a sample formed up to the protective layer 14 by the above-described procedure, by measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it was confirmed that an intermediate layer 13 was formed between the protective layer 14 and the Si layer as the uppermost layer of the Mo/Si multilayer reflective film. The composition of the intermediate layer 13 was such that nitrogen was 8 at %, and Si was 92 at %. Further, the thickness of the intermediate layer 13 was 1 nm.
(2) Surface Roughness
With respect to a sample formed up to the protective layer 14 by the above-described procedure, the surface roughness of the protective layer 14 was confirmed by means of an Atomic Force Microscope (No. SPI3800, manufactured by Seiko Instruments Inc.) in accordance with JIS-B0601 (1994). The surface roughness rms of the protective layer 14 was 0.15 nm.
(3) Cleaning Durability
With respect to a sample formed up to the protective layer 14 by the above-described procedure, the surface of the protective layer 14 was treated by spin cleaning with ozone water for a total of 600 seconds. Before and after this treatment, the EUV reflectivity was measured by means of an EUV reflectivity meter (MBR (tradename), manufactured by AIXUV) by applying EUV light (wavelength: 13.5 nm) to the surface of the protective layer 14. Deterioration in the EUV reflectivity as between before and after this treatment was 0.3%.
(4) Thermal Treatment Durability
To a sample formed up to the protective layer 14 by the above-described procedure, thermal treatment (in the atmospheric air) at 210° C. for 10 minutes is applied. As between before and after this treatment, deterioration in the EUV reflectivity is 3.7%.

Example 3

Example 3 was carried out in the same procedure as in Example 1 except that instead of the exposure of the Si layer surface to the nitrogen-containing atmosphere (the mixed gas atmosphere of nitrogen with argon) in which RF discharge was carried out, thermal treatment was carried out under the following exposure conditions without RF discharge.

After forming the Mo/Si multilayer reflective film, the surface of the Si layer as the uppermost layer of the Mo/Si multilayer reflective film is subjected to thermal treatment in a nitrogen-containing atmosphere (a mixed gas atmosphere of nitrogen with argon) in accordance with the following conditions without exposing it to the atmospheric air.
(Exposure Conditions)
  Atmosphere gas: Ar gas (carrier gas), flow rate: 17 sccm.
    Nitrogen gas, flow rate: 50 sccm
  Nitrogen gas partial pressure: 0.2 mTorr ($2.6 \times 10^{-2}$ Pa)
  Atmosphere pressure: 0.3 mTorr ($3.5 \times 10^{-2}$ Pa)
  Thermal treatment temperature: 140° C.
  Thermal treatment time: 600 sec
  Nitrogen partial pressure×thermal treatment time (exposure time to nitrogen-containing atmosphere): $1.2 \times 10^5$ L
    (1 L (Langmuir)=$1 \times 10^{-6}$ Torr·s=$1.33 \times 10$ Pa·s)

With respect to a mask blank obtained in the above procedure, the following evaluations are carried out.
(1) Film Composition
With respect to a sample formed up to the protective layer 14 by the above-described procedure, by measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it is confirmed that an intermediate layer 13 is formed between the protective layer 14 and the Si layer as the uppermost layer of the Mo/Si multilayer reflective film. The composition of the intermediate layer 13 is such that nitrogen is 6 at %, and Si is 94 at %. Further, the thickness of the intermediate layer 13 is 1 nm.
(2) Surface Roughness
With respect to a sample formed up to the protective layer 14 by the above-described procedure, the surface roughness of the protective layer 14 is confirmed by means of an Atomic Force Microscope (No. SPI3800, manufactured by Seiko Instruments Inc.) in accordance with JIS-B0601 (1994). The surface roughness rms of the protective layer 14 is 0.15 nm.
(3) Cleaning Durability
With respect to a sample formed up to the protective layer 14 by the above-described procedure, the surface of the protective layer 14 is treated by spin cleaning with ozone water for a total of 600 seconds. Before and after this treatment, the EUV reflectivity is measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment is 0.5%.
(4) Thermal Treatment Durability
To a sample formed up to the protective layer 14 by the above-described procedure, thermal treatment (in the atmospheric air) at 210° C. for 10 minutes is applied. As between before and after this treatment, deterioration in the EUV reflectivity is 4.3%.

Example 4

Example 4 is carried out in the same procedure as in Example 3 except that the exposure conditions in the nitrogen-containing atmosphere (the mixed gas atmosphere of nitrogen with argon) are changed to the following conditions.

(Exposure Conditions)
   Atmosphere gas: Ar gas (carrier gas), flow rate: 17 sccm.
      Nitrogen gas, flow rate: 50 sccm
   Nitrogen gas partial pressure: 0.2 mTorr ($2.6 \times 10^{-2}$ Pa)
   Atmosphere pressure: 0.3 mTorr ($3.5 \times 10^{-2}$ Pa)
   Thermal treatment temperature: 140° C.
   Thermal treatment time: 6,000 sec
   Nitrogen partial pressure×thermal treatment time (exposure time to nitrogen-containing atmosphere): $1.2 \times 10^6$ L
      (1 L (Langmuir)=$1 \times 10^{-6}$ Torr·s=$1.33 \times 10$ Pa·s)

With respect to a mask blank obtained in the above procedure, the following evaluations are carried out.

(1) Film Composition

With respect to a sample formed up to the protective layer 14 by the above-described procedure, by measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it is confirmed that an intermediate layer 13 is formed between the protective layer 14 and the Si layer as the uppermost layer of the Mo/Si multilayer reflective film. The composition of the intermediate layer 13 is such that nitrogen is 8 at %, and Si is 92 at %. Further, the thickness of the intermediate layer 13 is 1 nm.

(2) Surface Roughness

With respect to a sample formed up to the protective layer 14 by the above-described procedure, the surface roughness of the protective layer 14 is confirmed by means of an Atomic Force Microscope (No. SPI3800, manufactured by Seiko Instruments Inc.) in accordance with JIS-B0601 (1994). The surface roughness rms of the protective layer 14 is 0.15 nm.

(3) Cleaning Durability

With respect to a sample formed up to the protective layer 14 by the above-described procedure, the surface of the protective layer 14 is treated by spin cleaning with ozone water for a total of 600 seconds. Before and after this treatment, the EUV reflectivity is measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment is 0.3%.

(4) Thermal Treatment Durability

To a sample formed up to the protective layer 14 by the above-described procedure, thermal treatment (in the atmospheric air) at 210° C. for 10 minutes is applied. As between before and after this treatment, deterioration in the EUV reflectivity is 3.7%.

Comparative Example 1

Comparative Example 1 was carried out in the same procedure as in Example 1 except that after the formation of the reflective layer (Mo/Si multilayer reflective film) 12, a protective layer 14 was formed without exposing the Si layer as the uppermost layer of the Mo/Si multilayer reflective film to a nitrogen-containing atmosphere.

With respect to a mask blank obtained in the above procedure, the following evaluations were carried out.

(1) Film Composition

With respect to a sample formed up to the protective layer 14 by the above-described procedure, by measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), formation of an intermediate layer 13 was not observed between the protective layer 14 and the Si layer as the uppermost layer of the Mo/Si multilayer reflective film, and the nitrogen content in the laminate of the Si layer and the protective layer 14 was 0%.

(2) Surface Roughness

With respect to a sample formed up to the protective layer 14 by the above-described procedure, the surface roughness of the protective layer 14 was confirmed by means of an Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

With respect to a sample formed up to the protective layer 14 by the above-described procedure, the surface of the protective layer 14 was treated by spin cleaning with ozone water for a total of 600 seconds. Before and after this treatment, the EUV reflectivity was measured by means of an EUV reflectivity meter (MBR (tradename), manufactured by AIXUV) by applying EUV light (wavelength: 13.5 nm) to the surface of the protective layer 14. Deterioration in the EUV reflectivity as between before and after this treatment was 2.1%.

From this result, it was confirmed that the mask blank in Comparative Example 1 was inferior in the cleaning durability as compared with the mask blanks in Examples 1 to 4.

(4) Thermal Treatment Durability

To a sample formed up to the protective layer 14 by the above-described procedure, thermal treatment (in the atmospheric air) at 210° C. for 10 minutes was applied. As between before and after this treatment, deterioration in the EUV reflectivity was 7.8%.

From this result, it was confirmed that the mask blank in Comparative Example 1 was inferior in the thermal treatment durability as compared with the mask blanks in Examples 1 to 4.

Comparative Example 2

Comparative Example 2 was carried out in the same procedure as in Example 1 except that the Si layer surface was exposed to an Ar gas atmosphere under the following exposure conditions instead of the nitrogen-containing atmosphere.

(Exposure Conditions)
   Exposure gas: Ar gas, flow rate: 17 sccm (during RF discharge, Ar gas was supplied)
   Atmosphere pressure: 0.1 mTorr ($1.3 \times 10^{-2}$ Pa)
   Atmosphere temperature: 20° C.
   Exposure time: 600 sec
   Frequency of RF discharge: 1.8 MHz
   RF power: 500 W With respect to a mask blank obtained in the above procedure, the following evaluations were carried out.

(1) Film Composition

With respect to a sample formed up to the protective layer 14 by the above-described procedure, by measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), formation of an intermediate layer 13 was not observed between the protective layer 14 and the Si layer as the uppermost layer of the Mo/Si multilayer reflective film, and the nitrogen content in the laminate of the Si layer and the protective layer 14 was 0%.

(2) Surface Roughness

With respect to a sample formed up to the protective layer 14 by the above-described procedure, the surface roughness of the protective layer 14 was confirmed by means of an Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

With respect to a sample formed up to the protective layer 14 by the above-described procedure, the surface of the protective layer 14 was treated by spin cleaning with ozone water for a total of 600 seconds. Before and after this treatment, the EUV reflectivity was measured by means of an EUV reflectivity meter (MBR (tradename), manufactured by AIXUV) by applying EUV light (wavelength: 13.5 nm) to the surface of the protective layer 14. Deterioration in the EUV reflectivity as between before and after this treatment was 2.9%.

From this result, it was confirmed that the mask blank in Comparative Example 2 was inferior in the cleaning durability as compared with the mask blanks in Examples 1 to 4.

(4) Thermal Treatment Durability

To a sample formed up to the protective layer 14 by the above-described procedure, thermal treatment (in the atmospheric air) at 210° C. for 10 minutes is applied. As between before and after this treatment, deterioration in the EUV reflectivity is 7.8%.

From this result, it is confirmed that the mask blank in Comparative Example 2 is inferior in the thermal treatment durability as compared with the mask blanks in Examples 1 to 4.

Comparative Example 3

Comparative Example 3 is carried out in the same procedure as in Example 1 except that without subjecting the Si layer surface to thermal treatment or RF discharge, exposure is carried out under the following exposure conditions.

After forming the Mo/Si multilayer reflective film, the surface of the Si layer as the uppermost layer of the Mo/Si multilayer reflective film is exposed to a nitrogen-containing atmosphere (a mixed gas atmosphere of nitrogen with argon) in accordance with the following conditions without exposing it to the atmospheric air.

(Exposure Conditions)

Atmosphere gas: Ar gas (carrier gas), flow rate: 17 sccm. Nitrogen gas, flow rate: 50 sccm
Nitrogen gas partial pressure: 0.2 mTorr ($2.6 \times 10^{-2}$ Pa)
Atmosphere pressure: 0.3 mTorr ($3.5 \times 10^{-2}$ Pa)
Thermal treatment temperature: 20° C.
Thermal treatment time: 600 sec With respect to a mask blank obtained in the above procedure, the following evaluations are carried out.

(1) Film Composition

With respect to a sample formed up to the protective layer 14 by the above-described procedure, by measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), formation of an intermediate layer 13 is not observed between the protective layer 14 and the Si layer as the uppermost layer of the Mo/Si multilayer reflective film, and the nitrogen content in the laminate of the Si layer and the protective layer 14 is 0.2%.

(2) Surface Roughness

With respect to a sample formed up to the protective layer 14 by the above-described procedure, the surface roughness of the protective layer 14 is confirmed by means of an Atomic Force Microscope (No. SPI3800, manufactured by Seiko Instruments Inc.) in accordance with JIS-B0601 (1994). The surface roughness rms of the protective layer 14 is 0.15 nm.

(3) Cleaning Durability

With respect to a sample formed up to the protective layer 14 by the above-described procedure, the surface of the protective layer 14 is treated by spin cleaning with ozone water for a total of 600 seconds. Before and after this treatment, the EUV reflectivity is measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment is 1.9%. From this result, it is confirmed that the mask blank in Comparative Example 3 is inferior in the cleaning durability as compared with the mask blanks in Examples 1 to 4.

(4) Thermal Treatment Durability

To a sample formed up to the protective layer 14 by the above-described procedure, thermal treatment (in the atmospheric air) at 210° C. for 10 minutes is applied. As between before and after this treatment, deterioration in the EUV reflectivity is 7.4%.

From this result, it is confirmed that the mask blank in Comparative Example 3 is inferior in the thermal treatment durability as compared with the mask blanks in Examples 1 to 4.

Comparative Example 4

Comparative Example 4 was carried out in the same procedure as in Example 3 except that instead of the thermal treatment of the Si layer surface in the nitrogen-containing atmosphere, the thermal treatment was carried out in an Ar gas atmosphere in accordance with the following conditions.

(Thermal Treatment Conditions)

Atmosphere gas: Ar gas, flow rate: 17 sccm
Atmosphere pressure: 0.1 mTorr ($1.3 \times 10^{-2}$ Pa)
Thermal treatment temperature: 140° C.
Thermal treatment time: 600 sec With respect to a mask blank obtained in the above procedure, the following evaluations are carried out.

(1) Film Composition

With respect to a sample formed up to the protective layer 14 by the above-described procedure, by measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), formation of an intermediate layer 13 is not observed between the protective layer 14 and the Si layer as the uppermost layer of the Mo/Si multilayer reflective film, and the nitrogen content in the laminate of the Si layer and the protective layer 14 is 0%.

(2) Surface Roughness

With respect to a sample formed up to the protective layer 14 by the above-described procedure, the surface roughness of the protective layer 14 is confirmed by means of an Atomic Force Microscope (No. SPI3800, manufactured by Seiko Instruments Inc.) in accordance with JIS-B0601 (1994). The surface roughness rms of the protective layer 14 is 0.15 nm.

(3) Cleaning Durability

With respect to a sample formed up to the protective layer 14 by the above-described procedure, the surface of the protective layer 14 is treated by spin cleaning with ozone water for a total of 600 seconds. Before and after this treatment, the EUV reflectivity is measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment is 2.9%. From this result, it is confirmed that the mask blank in Comparative Example 4 is inferior in the cleaning durability as compared with the mask blanks in Examples 1 to 4.

(4) Thermal Treatment Durability

To a sample formed up to the protective layer 14 by the above-described procedure, thermal treatment (in the atmospheric air) at 210° C. for 10 minutes is applied. As between before and after this treatment, deterioration in the EUV reflectivity is 7.8%.

From this result, it is confirmed that the mask blank in Comparative Example 4 is inferior in the thermal treatment durability as compared with the mask blanks in Examples 1 to 4.

Comparative Example 5

Comparative Example 5 is carried out in the same procedure as in Example 3 except that the Si layer surface is exposed to the atmospheric air before thermally treating it in the nitrogen-containing atmosphere (the mixed gas atmosphere of nitrogen with argon).

(Conditions for Exposure to Atmospheric Air)
  Exposure gas: atmospheric air ($N_2$: about 78 vol %, $O_2$: about 21 vol %)
  Atmosphere pressure: 760 Torr ($1.0 \times 10^5$ Pa)
  Atmosphere temperature: 20° C.
  Exposure time: 600 sec (Conditions for Exposure to Nitrogen)
  Atmosphere gas: Ar gas (carrier gas), flow rate: 17 sccm. Nitrogen gas, flow rate: 50 sccm
  Nitrogen gas partial pressure: 0.2 mTorr ($2.6 \times 10^{-2}$ Pa)
  Atmosphere pressure: 0.3 mTorr ($3.5 \times 10^{-2}$ Pa)
  Thermal treatment temperature: 140° C.
  Thermal treatment time: 600 sec
  Nitrogen partial pressure×thermal treatment time (exposure time to nitrogen-containing atmosphere): $1.2 \times 10^6$ L (1 L (Langmuir)=$1 \times 10^{-6}$ Torr·s=$1.33 \times 10^{-4}$ Pa·s)

With respect to a mask blank obtained in the above procedure, the following evaluations are carried out.

(1) Film Composition

With respect to a sample formed up to the protective layer 14 by the above-described procedure, by measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it is confirmed that an intermediate layer 13 is formed between the protective layer 14 and the Si layer as the uppermost layer of the Mo/Si multilayer reflective film. The composition of the intermediate layer 13 is such that oxygen is 4 at %, nitrogen is 1 at % and Si is 95 at %. Further, the thickness of the intermediate layer 13 is 1 nm.

(2) Surface Roughness

With respect to a sample formed up to the protective layer 14 by the above-described procedure, the surface roughness of the protective layer 14 is confirmed by means of an Atomic Force Microscope (No. SPI3800, manufactured by Seiko Instruments Inc.) in accordance with JIS-B0601 (1994). The surface roughness rms of the protective layer 14 is 0.15 nm.

(3) Cleaning Durability

With respect to a sample formed up to the protective layer 14 by the above-described procedure, the surface of the protective layer 14 is treated by spin cleaning with ozone water for a total of 600 seconds. Before and after this treatment, the EUV reflectivity is measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment is 0.8%. From this result, it is confirmed that the mask blank in Comparative Example 5 is inferior in the cleaning durability as compared with the mask blanks in Examples 1 to 4, although its cleaning durability is improved as compared with Comparative Example 1.

(4) Thermal Treatment Durability

To a sample formed up to the protective layer 14 by the above-described procedure, thermal treatment (in the atmospheric air) at 210° C. for 10 minutes is applied. As between before and after this treatment, deterioration in the EUV reflectivity is 8.1%.

From this result, it is confirmed that the mask blank in Comparative Example 5 is inferior in the thermal treatment durability as compared with the mask blanks in Examples 1 to 4.

Example 5

Example 5 was carried out in the same procedure as in Example 1 except that at the time of exposing the Si layer as the uppermost layer of the Mo/Si multilayer reflective film to the nitrogen-containing atmosphere (the mixed gas atmosphere of nitrogen with argon), no RF discharge was carried out, and the Si layer surface was irradiated with ultraviolet rays in accordance with the following conditions.

(Exposure Conditions)
  Carrier gas: Ar gas, flow rate: 17 sccm
  Exposure gas: nitrogen gas, flow rate: 50 sccm
  Nitrogen gas partial pressure: 0.2 mTorr ($2.6 \times 10^{-2}$ Pa)
  Atmosphere pressure: 0.3 mTorr ($3.5 \times 10^{-2}$ Pa)
  Atmosphere temperature: 20° C.
  Exposure time: 600 sec
  Exposure amount: $1.2 \times 10^6$ L (1 L (Langmuir)=$1 \times 10^{-6}$ Torr·s=$1.33 \times 10^{-4}$ Pa·s)
  Ultraviolet irradiation power source: argon excimer lamp
  Ultraviolet wavelength: 126 nm
  Distance between lamp window (magnesium fluoride) to substrate: 5 cm With respect to a mask blank obtained in the above procedure, the following evaluations were carried out.

(1) Film Composition

With respect to a sample formed up to the protective layer 14 by the above-described procedure, by measuring the composition in the depth direction from the surface of the protective layer 14 to the reflective layer (Mo/Si multilayer reflective film) 12 by means of an X-ray Photoelectron Spectrometer (Quantera SXM, manufactured by ULVAC-PHI, Inc.), it was confirmed that an intermediate layer 13 was formed between the protective layer 14 and the Si layer as the uppermost layer of the Mo/Si multilayer reflective film. The composition of the intermediate layer 13 was such that nitrogen was 8 at %, and Si was 92 at %. Further, the thickness of the intermediate layer 13 was 1 nm.

(2) Surface Roughness

With respect to a sample formed up to the protective layer 14 by the above-described procedure, the surface roughness of the protective layer 14 was confirmed by means of an Atomic Force Microscope (No. SPI3800, manufactured by Seiko Instruments Inc.) in accordance with JIS-B0601 (1994). The surface roughness rms of the protective layer 14 was 0.15 nm.

(3) Cleaning Durability

With respect to a sample formed up to the protective layer 14 by the above-described procedure, the surface of the protective layer 14 was treated by spin cleaning with ozone water for a total of 600 seconds. Before and after this treatment, the EUV reflectivity was measured by means of an EUV reflectivity meter (MBR (trade name), manufactured by AIXUV) by applying EUV light (wavelength: 13.5 nm) to the surface of the protective layer 14. Deterioration in the EUV reflectivity as between before and after this treatment was 0.3%.

(4) Thermal Treatment Durability

To a sample formed up to the protective layer 14 by the above-described procedure, thermal treatment (in the atmospheric air) at 210° C. for 10 minutes is applied. As between before and after this treatment, deterioration in the EUV reflectivity is 3.7%.

INDUSTRIAL APPLICABILITY

In the reflective layer-equipped substrate for EUV lithography of the present invention and the reflective mask blank for EUV lithography employing such a reflective layer-equipped substrate, deterioration in the EUV light reflectivity due to oxidation of the Ru protective layer is prevented. And, by prevention of progress with time of the deterioration in the EUV light reflectivity during the EUV exposure, it becomes unnecessary to change the exposure conditions in a half way, and it is possible to prolong the useful life of a photomask.

Further, an EUV mask prepared by using the EUV mask blank of the present invention is a highly reliable EUV mask with little change with time of the EUV light reflectivity during the EUV exposure and is useful for the production of more refined semiconductor integrated circuits.

REFERENCE SYMBOLS 1, 1': EUV mask blank
11: Substrate
12: Reflective layer
13: Intermediate layer
14: Protective layer
15: Absorber layer
16: Low reflective layer

What is claimed is:

1. A reflective layer-equipped substrate for EUV lithography, comprising:
a substrate;
a reflective layer which reflects EUV light and is formed on the substrate;
an intermediate layer formed on the reflective layer; and
a protective layer which protects the reflective layer and is formed on the intermediate layer,
wherein the reflective layer comprises a Mo/Si multilayer reflective film, the protective layer comprises a Ru layer or a Ru compound layer, and the intermediate layer includes nitrogen in an amount of from 0.5 to 25 at % and Si in an amount of from 75 to 99.5 at %.

2. The reflective layer-equipped substrate for EUV lithography according to claim 1, wherein the reflective layer includes a Si film forming an uppermost layer of the Mo/Si multilayer reflective film, and the intermediate layer is formed in contact with the Si film.

3. The reflective layer-equipped substrate for EUV lithography according to claim 1, wherein the intermediate layer has a thickness in a range of from 0.2 to 2.5 nm.

4. The reflective layer-equipped substrate for EUV lithography according to claim 1, wherein the protective layer has a surface roughness of at most 0.5 nm in rms.

5. The reflective layer-equipped substrate for EUV lithography according to claim 1, wherein the protective layer has a thickness in a range of from 1 to 10 nm.

6. The reflective layer-equipped substrate for EUV lithography according to claim 1, wherein the intermediate layer is formed by exposing a surface of an uppermost layer of the multilayer reflective film to a nitrogen-containing atmosphere without exposing to atmospheric air such that the intermediate layer is formed on the multilayer reflective film, and the uppermost layer of the Mo/Si multilayer reflective film is a Si film.

7. A reflective mask blank for EUV lithography comprising:
a substrate;
a reflective layer which reflects EUV light and is formed on the substrate;
an intermediate layer formed on the reflective layer;
a protective layer which protects the reflective layer and is formed on the intermediate layer; and
an absorber layer formed on the protective layer,
wherein the reflective layer comprises a Mo/Si multilayer reflective film, the protective layer comprises a Ru layer or a Ru compound layer, and the intermediate layer includes nitrogen in an amount of from 0.5 to 25 at % and Si in an amount of from 75 to 99.5 at %.

8. The reflective mask blank for EUV lithography according to claim 7, wherein the absorber layer is made of a material comprising tantalum as a main component.

9. The reflective mask blank for EUV lithography according to claim 7, wherein the protective layer and the absorber layer have an etching selectivity of at least 10 between the protective layer and the absorber layer for dry etching.

10. The reflective mask blank for EUV lithography according to claim 7, further comprising:
a low reflective layer for inspection of a mask pattern by an inspection light, wherein the low reflective layer is made of a material comprising tantalum as a main component and is formed on the absorber layer.

11. The reflective mask blank for EUV lithography according to claim 10, wherein the low reflective layer has a contrast of at least 30% between reflected light on a surface of the protective layer and reflected light on a surface of the low reflective layer to a wavelength of light for the inspection of a pattern to be formed in the absorber layer.

12. A reflective mask for EUV lithography obtained by patterning the EUV reflective mask blank as defined in claim 7.

13. A process for producing a semiconductor integrated circuit, comprising:
subjecting an object to be exposed to exposure through the reflective mask for EUV lithography as defined in claim 12.

14. A process for producing a reflective layer-equipped substrate for EUV lithography, comprising:
forming a multilayer reflective film for reflecting EUV light on a film-forming surface of a substrate;
exposing a surface of an uppermost layer of the multilayer reflective film to a nitrogen-containing atmosphere without exposing to atmospheric air such that an intermediate layer including nitrogen in an amount of from 0.5 to 25 at % and Si in an amount of from 75 to 99.5 at % is formed on the multilayer reflective film; and forming on the intermediate layer a protective layer for protecting the multilayer reflective film after the exposing, wherein the multilayer reflective film comprises a Mo/Si multilayer reflective film, the protective layer comprises a Ru layer or a Ru compound layer, and the uppermost layer of the Mo/Si multilayer reflective film is a Si film.

15. The process for producing a reflective layer-equipped substrate for EUV lithography according to claim 14, wherein the nitrogen-containing atmosphere has a product of a nitrogen partial pressure and an exposure time which is at least $1\times10^{-6}$ Torr·s, and the nitrogen-containing atmosphere has a temperature in a range of from 0 to 170° C.

16. The process for producing a reflective layer-equipped substrate for EUV lithography according to claim 14, wherein the nitrogen-containing atmosphere has a product of a nitrogen partial pressure and an exposure time which is at least $1\times10^{-6}$ Torr·s, and the nitrogen-containing atmosphere has a temperature in a range of from 0 to 160° C.

17. The process for producing a reflective layer-equipped substrate for EUV lithography according to claim 14, wherein the nitrogen-containing atmosphere and he has a product of a nitrogen partial pressure and an exposure time which is at least $1\times10^{-6}$ Torr·s, and the nitrogen-containing atmosphere has a temperature in a range of from 0 to 150° C.

18. The process for producing a reflective layer-equipped substrate for EUV lithography according to claim 14, wherein the nitrogen-containing atmosphere is maintained in a plasma state.

19. The process for producing a reflective layer-equipped substrate for EUV lithography according to claim 14, further comprising:

applying thermal treatment to the surface of the Si film.

20. The process for producing a reflective layer-equipped substrate for EUV lithography according to claim 14, further comprising:

irradiating ultraviolet ray upon the surface of the Si film.

* * * * *